United States Patent [19]

Paranjpe

[11] Patent Number: 5,436,528
[45] Date of Patent: Jul. 25, 1995

[54] PLASMA SOURCE EMPLOYING SPIRAL RF COIL AND METHOD FOR USING SAME

[75] Inventor: Ajit P. Paranjpe, Dallas, Tex.

[73] Assignee: Texas Instruments Incorporated, Dallas, Tex.

[21] Appl. No.: 97,498

[22] Filed: Jul. 26, 1993

Related U.S. Application Data

[63] Continuation of Ser. No. 868,818, Apr. 15, 1992, Pat. No. 5,231,334.

[51] Int. Cl.$^6$ .................... H01J 1/00; H01J 37/00
[52] U.S. Cl. .................. 315/111.51; 315/244; 315/248; 315/344; 313/231.31; 313/238; 313/325
[58] Field of Search ............ 315/50, 56, 71, 112, 315/111.21, 111.51, 111.71, 233, 235, 244, 248, 326, 344; 313/153, 231.01, 231.31, 231.51, 231.61, 234, 238, 325

[56] References Cited

U.S. PATENT DOCUMENTS

| | | | |
|---|---|---|---|
| 3,343,022 | 9/1967 | Eckert | 313/231.31 |
| 4,156,159 | 5/1979 | Takagi | 313/231.31 |
| 4,894,591 | 1/1990 | Witting | 313/153 X |
| 5,036,252 | 7/1991 | Lob | 313/231.31 X |
| 5,216,329 | 6/1993 | Pelleteir | 315/111.21 X |
| 5,226,967 | 7/1993 | Chen et al. | 315/111.21 X |

Primary Examiner—David Mis
Attorney, Agent, or Firm—John D. Crane; Richard L. Donaldson

[57] ABSTRACT

A plasma source for generating a plasma in a chamber in conjunction with a radio frequency generator is described. The plasma source comprises a coil spiral, at least one insulator and at least one capacitor. The coil spiral conducts the radio frequency wave from the radio frequency generator and induces a plasma in the chamber. It comprises at least two segments. Each insulator and capacitor couple two adjacent segments of the coil spiral together.

19 Claims, 2 Drawing Sheets

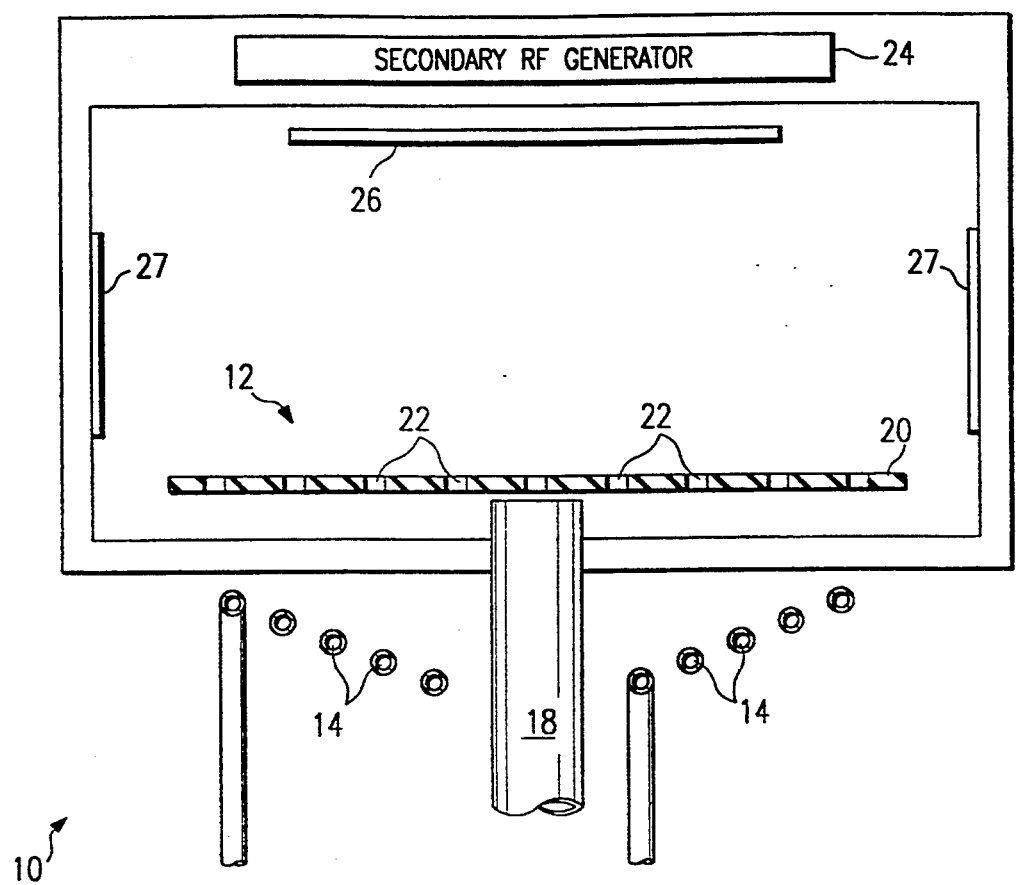

PLASMA SOURCE EMPLOYING SPIRAL RF COIL AND METHOD FOR USING SAME

This is a continuation of application Ser. No. 07/868,818, filed Apr. 15, 1992, now U.S. Pat. No. 5,231,334.

TECHNICAL FIELD OF THE INVENTION

This invention relates in general to radio frequency devices and more particularly to a radio frequency plasma source.

BACKGROUND OF THE INVENTION

Inductively coupled plasmas ("ICPs") generated with radio frequency ("RF") waves having a frequency generally between 1 MHz and 100 MHz are capable of providing charged particle (electron and ion) concentrations in excess of $10^{11} cm^{-3}$ and ion currents to wafer substrates in excess of 5 mA/$cm^2$. The ICP source is thus competitive with electron cyclotron resonance ("ECR") plasma sources for plasma processing applications in integrated circuit manufacturing processes. Inductively coupled RF plasma sources have advantages over both capacitively coupled RF plasma sources and ECR plasma sources.

In contrast to capacitive RF coupling, inductively coupled RF plasmas have substantially lower intrinsic plasma potentials ($<50$ V) and achieve a substantially higher ionization efficiency ($>5\%$). Also, the intrinsic plasma potential is relatively independent of the RF power. The low intrinsic plasma potential is useful in applications where high ion energies cannot be tolerated.

As in the case of ECR systems, the ion energy of an inductively coupled RF plasma can be varied independently by biasing the integrated circuit wafer with a separate RF power supply. The ICP source, however, has the advantage of operating over a pressure range that is more compatible with process requirements (1 mTorr to 50 mTorr). An ECR source is most effective at pressures below 10 mTorr. In addition, the ICP source can provide a larger diameter (15 cm to 30 cm), homogeneous plasma, in a compact design, and at substantially lower cost than an ECR source. Since the operating pressure is higher, the pumping requirements for a given gas flow rate are more modest.

A first type of prior plasma source employing RF induction coupling, couples energy into the plasma through whistler or helicon waves. This source is called a helicon plasma source. In the presence of a magnetic field ranging from 100 G to 1 kG directed along the axis of the source, a standing whistler wave can be excited by applying an RF voltage to a loop antenna located around the source cavity. Although these axial magnetic fields are generally weaker than the magnetic fields employed in ECR sources, the plasma is non-uniform across the diameter of the source. Thus, the wafer must be located away or "downstream" of the source, in a region where the plasma is sufficiently uniform. This requires the input power of the source to be increased to maintain a sufficient plasma density (i.e., electron and ion concentration) at the downstream position. Also, large solenoidal coils are required to generate the axial magnetic field. These increase source cost and complexity.

A second type of prior plasma source differs from the generic whistler wave or helicon source by omitting the axial magnetic field. The wafer can therefore be placed within the plasma generation region. Even though the peak plasma densities ($5 \times 10^{11} cm^{-3}$) for such a source are about an order of magnitude lower than those for the whistler wave source, the proximity of the wafer to the source ensures that processing rates are comparable. Etch rates of over 1 $\mu$m/min are possible for many materials of interest. This source is simpler, more compact, and cheaper than the helicon plasma source.

The second type of induction plasma source employs a multi-turn pancake coil located along the top surface of a cylindrical vacuum chamber. A quartz vacuum window, typically 0.5 in. thick, isolates the coil from the chamber. When the coil is powered by an RF source, large currents circulate in the coils. These currents induce intense electric fields inside the chamber that sustain the plasma.

The time-varying magnetic and electric fields generated by a pancake coil are proportional to the coil current, and scale as the square of the number of coil turns. The uniformity of the induced field improves with increasing coil turns. However, the inductance of the coil is proportional to the square of the number of coil turns. This implies that the voltage drop across the coil increases with an increasing number of coil turns for a fixed coil current. As an example, the voltage drop across a 5 $\mu$H coil for an RMS current of 20 A at 13.56 MHz is 8.5 kV. Such a high voltage is a hazard and results in capacitive energy coupling between the coil and the plasma. Capacitive coupling is undesirable because the intrinsic plasma potential increases dramatically if a significant amount of energy is transferred via capacitive coupling. These issues constrain the number of coil turns to about three in prior RF plasma sources.

Therefore a need has arisen for an RF plasma source which minimizes the number of system components, efficiently uses output power, provides good plasma uniformity, and maintains coil voltages at safe levels.

SUMMARY OF THE INVENTION

In accordance with the present invention a plasma source and method of manufacture are provided which substantially eliminate or reduce disadvantages and problems associated with prior plasma sources.

A plasma source for generating a plasma in a chamber in conjunction with a radio frequency generator is described. The plasma source comprises a coil spiral, at least one insulator and at least one capacitor. The coil spiral conducts the radio frequency wave from the radio frequency generator and induces a plasma in the chamber. The coil comprises at least two segments. Each insulator and capacitor couple two adjacent segments of the coil spiral together.

A first technical advantage of the disclosed invention is the significant reduction of the use of high voltage in the source. By segmenting the coil into pieces, the maximum voltage drop across any two points in the coil can be significantly reduced. Also, the addition of the ground shield reduces the coil voltage even further. The reduced coil voltage for a given RF current permits the use of thinner dielectrics/insulators between the coil and the plasma, thus resulting in a higher plasma density.

A second technical advantage of the disclosed invention is its elimination of the restriction on the maximum number of turns in the coil. The effect of segmenting the coil into pieces allows a high number of coil turns to be used. This combined with the conical coil shape increases the resultant plasma uniformity.

BRIEF DESCRIPTION OF THE DRAWINGS

For a more complete understanding of the present invention, and the advantages thereof, reference is now made to the following descriptions taken in conjunction with the accompanying drawings, in which:

FIG. 3 depicts a partially cross-sectional, partially schematic diagram of an Advanced Vacuum Processor employing an external plasma source.

DETAILED DESCRIPTION OF THE INVENTION

Figure 1:
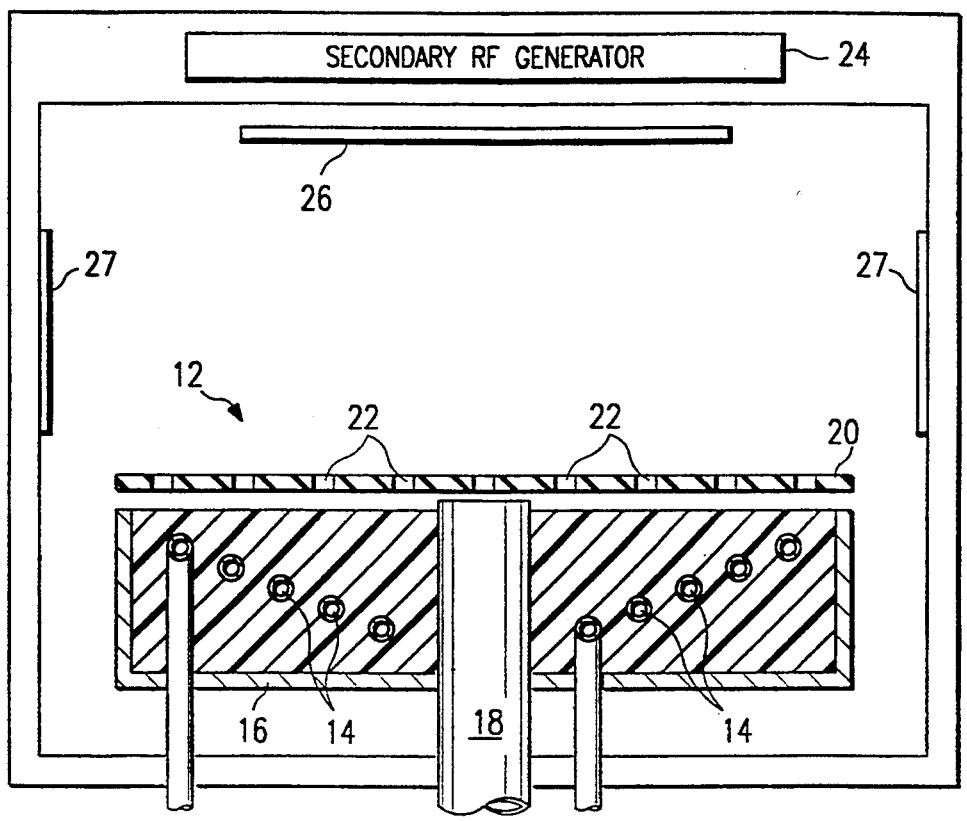
FIG. 1 depicts a partially cross-sectional, partially schematic diagram of an Advanced Vacuum Processor employing the disclosed plasma source.
Figure 2:
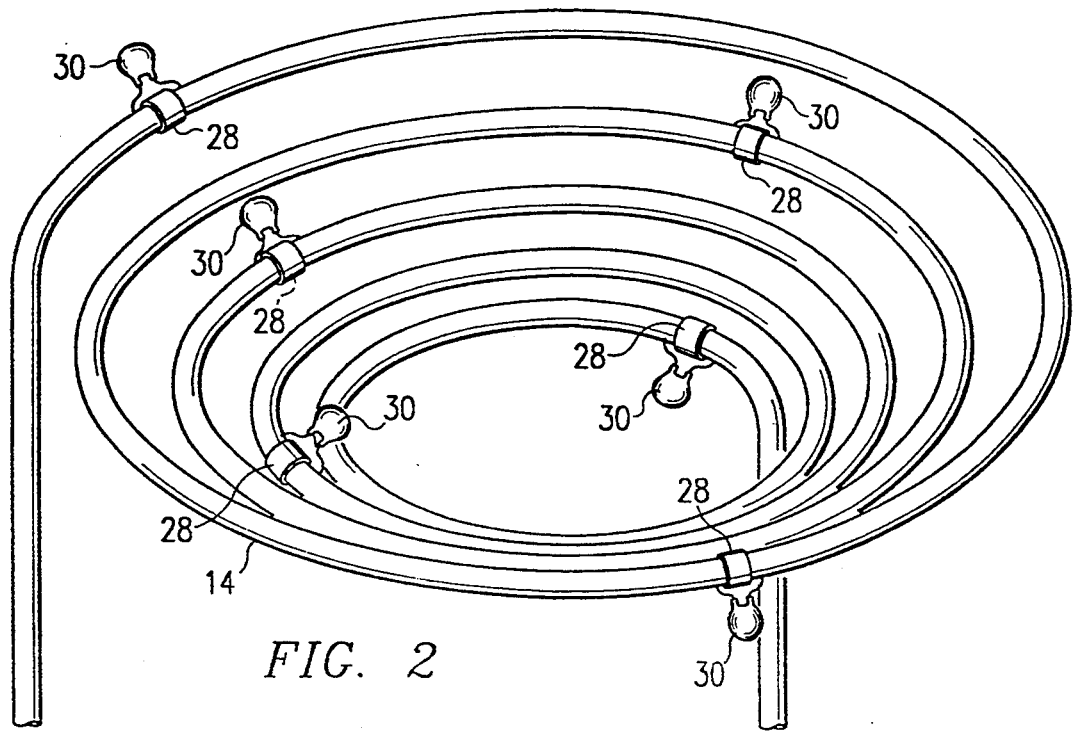
FIG. 2 depicts a partially isometric, partially schematic diagram of the plasma source depicted in FIG. 1.

The preferred embodiment of the present invention and its advantages are best understood by referring to FIGS. 1 and 2 of the drawings, like numerals being used for like and corresponding parts of the various drawings.

FIG. 1 depicts a partially cross-sectional, partially schematic diagram of an Advanced Vacuum Processor ("AVP"), chamber indicated generally at 10, employing the disclosed plasma source, indicated generally at 12. Plasma source 12 consists of a coil wound into a spiral 14 ("coil spiral"). Typically, one end of coil spiral 14 is electrically grounded, while the other end is connected to an RF generator (not shown). A ground shield 16 below coil spiral 14 ensures that the plasma is not generated below plasma source 12. This allows a smaller current to generate the same field strength. The ground field reduces the impedance of the coil spiral 14. Ground shield 16 may extend upwards along the sides of coil spiral 14 to protect plasma source 12 from the harsh environment of AVP chamber 10. Ground shield 16 typically is manufactured from aluminum and has a number of radial cuts to minimize eddy current heating.

Plasma source 12 contains a number of capacitors (depicted and described in connection with FIG. 2). For materials reasons, these capacitors and coil spiral 14 are encased in epoxy, indicated by the alternating dark and light hatching. The epoxy used in the depicted embodiment is a general purpose epoxy encapsulant. Any suitable encapsulant may be used. The epoxy may be omitted if the capacitors are selected so that they withstand the harsh environment of AVP chamber 10 or the coil assembly is located outside chamber 10, as illustrated in FIG. 3. Plasma source 12 also contains a conduit 18 through which chemicals are injected into AVP chamber 10 and a plasma is created therefrom. A dispersal cap 20 covers plasma source 12. Cap 20 contains a number of small holes 22 through which chemical reactants injected through conduit 18 are more evenly dispersed into AVP chamber 10. The location and sizes of the holes are optimized to provide the best process uniformity. Cap 20 may be used as a disposable shield to protect plasma source 12 from the harsh environment of AVP 10.

In addition, a set of eight magnets (not shown) around the periphery of AVP chamber 10 may be provided to generate a multipolar magnetic field to improve plasma confinement. The plasma also may be improved by installing a secondary RF generator 24 in the chuck near the semiconductor wafer 26. While coil spiral 22 is designed for use with one power supply, typically a 13.56 MHz RF power supply, the chuck may be powered by a second higher or lower frequency source to reduce interference between the two RF power supplies. If two generators having the same frequency are used to power the coil and the chuck, the two generators may operated as a master-slave pair. In this mode the common exciter output of one generator is used to drive the common exciter input of the second generator through a variable phase shifter. By adjusting the phase of the shifter, the outputs of the two generators may be phase matched to eliminate interference. Plasma source 12 is responsible for plasma generation, while secondary RF generator may be used to vary the energy of ions incident on wafer 26.

A third cylindrical electrode 27 around the periphery of chamber 10 may be included to allow the triode mode of operation. Electrode 27 may be powered by a third RF generator (not shown) or may simply be grounded. In the grounded mode, electrode 31 further dampens interference between the two other generators.

Coil spiral 14 is shown to consist of 5 turns having a conical profile. The coils may also be staggered or non-uniformly spaced in order to optimize the plasma uniformity in both the vertical and horizontal dimensions For example, the spiral coil may have a flat profile or may have a radius which varies as some function of position along the coil spiral. Multiple coil spirals may also be stacked on top of each other, if desired, provided the effective coil inductance is less than 1 $\mu$H.

The operation of plasma source 12 in AVP chamber 10 is conventional. The manufacture and performance of plasma source 12, the selection of capacitors, and the segmentation of the coil spiral is more fully described in connection with FIG. 2.

FIG. 2 depicts a partially isometric partially schematic diagram of the plasma source 12 depicted in FIG. 1. Here, plasma source 12 is depicted without ground shield 16, conduit 18, cap 20, or epoxy. Coil spiral 14 is broken into segments as will be described subsequently. Each segment is connected to the adjacent segment or segments by an insulator or insulators 28. Each segment is also connected to the adjacent segments or segments by a capacitor or capacitors 30. Each capacitor 30 is electrically connected in series between two adjacent segments of coil spiral 14. Each end segment has a single insulator and capacitor. The interior segments are connected to two insulators and capacitors, one of each, at each end.

In the depicted embodiment insulators 28 contain an internal passageway to allow the unimpeded flow of coolant. The coolant is typically water.

Rather than use a continuous coil of tubing, the coil spiral is broken into N segments (where N ranges, typically, from 5-10). Capacitor 30 is inserted between adjacent segments. The lengths of the individual segments of the coil spiral are chosen so that the voltage drops across each of the segments, end to end, are equal. The capacitors are also chosen such that they series resonate with the inductance of the coil at the operating frequency of the associated RF generator. In effect, the voltage drop across each capacitor is equal in magnitude and opposite in polarity to the voltage drop across the corresponding segment of the coil. If L is the inductance of the unsegmented coil, then the capacitance (C) required is given by:

$$C = \frac{N}{4\pi^2 f^2 L} \tag{1}$$

where f equals the frequency of the generated radio frequency wave. Here, f=13.56 MHz. The impedance of the unsegmented coil is given by:

$$Z = R + j2\pi fL \tag{2}$$

where R is the coil resistance. R is much smaller than the imaginary part of the coil impedance ($2\pi fL$). The impedance of the coil with embedded capacitors is given by:

$$Z = R + j\left(2\pi fL - \frac{N}{2\pi fC}\right) \tag{3}$$

Embedding capacitors in the coil reduces the impedance of the coil by the factor:

$$\frac{R + j\left(2\pi fL - \frac{N}{2\pi fC}\right)}{R + j2\pi fL} \tag{4}$$

which tends to $R/2\pi fL$, when the capacitors satisfy Equation 1. Such a situation is rarely obtained in practice since capacitors can only be obtained for discrete values. In such a case, Equation 4 can be used to determine the reduction in coil impedance. Another quantity of interest is the maximum voltage between any two points on the coil. If the coil is divided in N sections, the maximum voltage is reduced by a factor of N.

For example, a 3 turn coil with an inductance of 1 $\mu$H requires C=552 pF if 4 capacitors are used. However, if 4 capacitors of 600 pF each are used instead, the impedance of the coil at 13.56 MHz reduces by a factor of 12. Thus, the total voltage drop across the coil for 20 A RF current reduces from 1.7 kV to 140 V. In the case of the unsegmented coil, the maximum voltage between two points on the coil is 1.7 kV. This reduces to 425 V if the coil is split into 4 sections with embedded capacitors.

The embedded capacitors reduce the coil voltages, which is essential to minimize capacitive coupling between adjacent coil turns, and between the coil and the plasma. The magnetic energy stored in the coil spiral, however, remains unchanged for a fixed current. Thus, the induced electric and magnetic fields remain unchanged.

Adding capacitors increases the series resistance of the coil. The dielectrics used in capacitors are lossy, and if D is the loss factor for the dielectric material, the equivalent series resistance is given by:

$$R_C = \frac{D}{2\pi fC} \tag{5}$$

For many capacitors, the series resistance may approach 1 $\Omega$ at 13.56 MHz. For an RMS current of 20 A through the coil, this corresponds to a power dissipation of 400 W. In order to reduce the power dissipation to reasonable levels (<40 W), the series resistance of the capacitors has to be less than 0.1 $\Omega$.

Although the present invention and its advantages have been described in detail, it should be understood that various changes, substitutions and alterations can be made herein without departing from the spirit and scope of the invention as defined by the appended claims.

What is claimed is:

1. A plasma processing system, comprising:
   (a) a processing chamber containing a semiconductor wafer chuck;
   (b) a coil spiral with the axis of said coil spiral being aligned with said chuck, said coil spiral being of conical profile; and
   (c) an RF power supply coupled to said coil spiral;
   (d) whereby said RF power supply energizes said coil spiral to induce a plasma in said chamber adjacent said semiconductor wafer chuck.

2. The system of claim 1, wherein:
   (a) said coil sprial is located outside of said chamber.

3. The system of claim 1, wherein:
   (a) said coil spiral is located within said chamber.

4. The system of claim 3, further comprising:
   (a) a ground shield adjacent said coil spiral and remote from said chuck.

5. The system of claim 4, further comprising:
   (a) epoxy encapsulant affixing said coil spiral to said ground shield.

6. The system of claim 1, wherein:
   (a) said coil spiral includes N conductive segments coupled together in series by capacitor(s), where N is a positive integer greater than 1.

7. The system of claim 1, wherein:
   (a) said coil spiral includes a coolant passageway.

8. The system of claim 1, further comprising:
   (a) a second RF power supply coupled between said coil spiral and said chuck.

9. A plasma processing system, comprising:
   (a) a processing chamber containing a semiconductor wafer chuck;
   (b) a coil spiral within said chamber, the axis of said coil spiral being aligned with said chuck; and
   (c) an RF power supply coupled to said coil spiral;
   (d) whereby said RF power supply energizes said coil spiral to induce a plasma in said chamber adjacent said semiconductor wafer chuck.

10. The system of claim 9; wherein:
    (a) said coil spiral has a conical profile.

11. The system of claim 9, further comprising:
    (a) a ground shield adjacent said coil spiral and remote from said chuck.

12. The system of claim 11, further comprising:
    (a) epoxy encapsulant affixing said coil spiral to said ground shield.

13. The system of claim 9, wherein:
    (a) said coil spiral includes N conductive segments coupled together in series by capacitor(s), where N is a positive integer greater than 1.

14. The system of claim 9, wherein:
    (a) said coil spiral includes a coolant passageway.

15. The system of claim 9, further comprising:
    (a) a second RF power supply coupled between said coil spiral and said chuck.

16. A method of semiconductor wafer processing, comprising the steps of:
    (a) providing a processing chamber containing a semiconductor wafer chuck;
    (b) providing a coil spiral with a conical profile and having an axis thereof aligned with said chuck;
    (c) providing a semiconductor wafer in said chuck; and (d) applying RF power to said coil spiral to induce a plasma adjacent said semiconductor wafer.
17. The method of claim 16, wherein:
(a) said coil spiral is outside of said chamber.
18. The method of claim 16, wherein:
(a) said coil spiral is within said chamber.
19. The method of claim 16, wherein:
(a) said coil spiral includes N conductive segments coupled together in series by capacitor(s), where N is a positive integer greater than 1.

* * * * *